United States Patent
Ivanov et al.

(10) Patent No.: US 10,033,331 B1
(45) Date of Patent: Jul. 24, 2018

(54) OP-AMP IC CHIP

(71) Applicant: TEXAS INSTRUMENTS INCORPORATED, Dallas, TX (US)

(72) Inventors: Vadim Valerievich Ivanov, Tucson, AZ (US); Jerry L. Doorenbos, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/394,399

(22) Filed: Dec. 29, 2016

(51) Int. Cl.
*H03F 3/45* (2006.01)
*H03F 1/02* (2006.01)
*H03F 3/195* (2006.01)
*H03F 1/32* (2006.01)
*H03F 3/187* (2006.01)

(52) U.S. Cl.
CPC ....... *H03F 1/0205* (2013.01); *H03F 3/45179* (2013.01); *H03F 1/3247* (2013.01); *H03F 3/187* (2013.01); *H03F 3/195* (2013.01); *H03F 2200/471* (2013.01); *H03F 2200/555* (2013.01); *H03F 2203/45074* (2013.01)

(58) Field of Classification Search
CPC . H03F 1/02; H03F 1/303; H03F 3/005; H03F 3/2178; H03F 2200/231; H03F 2200/249; H03F 2200/375; H03F 2200/396; H03F 2200/414; H03F 2203/7212; H03F 2203/7233; H03F 3/45475; H03F 3/45; H03F 3/04
USPC ............................................ 330/9, 253, 307
See application file for complete search history.

(56) References Cited

U.S. PATENT DOCUMENTS

| | | | |
|---|---|---|---|
| 5,061,900 A * | 10/1991 | Vinn | H03F 3/45479 330/9 |
| 5,903,504 A | 5/1999 | Chevallier et al. | |
| 6,194,962 B1 | 2/2001 | Chen | |
| 6,424,211 B1 | 7/2002 | Nolan et al. | |
| 6,459,335 B1 * | 10/2002 | Darmawaskita | H03F 3/45977 330/9 |
| 6,573,783 B2 * | 6/2003 | Gray | H03F 3/45771 330/253 |
| 6,621,284 B2 | 9/2003 | D'Angelo | |
| 6,853,164 B1 | 2/2005 | Prinz et al. | |
| 6,927,624 B2 | 8/2005 | Ivanov et al. | |
| 7,265,611 B2 * | 9/2007 | Wang | H03F 3/45753 327/307 |
| 7,459,966 B2 * | 12/2008 | Nakao | H03F 3/45192 330/9 |

(Continued)

FOREIGN PATENT DOCUMENTS

WO  200201708 A2  1/2002

*Primary Examiner* — Khanh V Nguyen
(74) *Attorney, Agent, or Firm* — John R. Pessetto; Charles A. Brill; Frank D. Cimino (57) ABSTRACT

An integrated circuit (IC) chip can include an operational amplifier with adjustable operational parameters. The IC chip can also include a trimming module configured to measure an output voltage of the operational amplifier in response to at least one of detecting that the operational amplifier has a positive supply voltage set to a level greater than a predetermined level and detecting a given common mode voltage at inverting and non-inverting inputs of the operational amplifier. The trimming module can also be configured to adjust the operational parameters of the operational amplifier based on the output voltage to trim the operational amplifier.

13 Claims, 4 Drawing Sheets

(56) References Cited

U.S. PATENT DOCUMENTS

| | | | | |
|---|---|---|---|---|
| 7,671,683 | B2 * | 3/2010 | Agawa | H03F 3/45475 330/260 |
| 8,400,337 | B1 * | 3/2013 | Xu | H03F 3/45183 327/307 |
| 9,716,398 | B2 * | 7/2017 | Lee | H02J 7/007 |
| 2013/0033320 | A1 | 2/2013 | Xu | |

* cited by examiner

OP-AMP IC CHIP

TECHNICAL FIELD

An operational amplifier integrated circuit (IC) chip is disclosed. More particularly, the op-amp IC chip includes a trimming module for trimming the operational amplifier.

BACKGROUND

An operational amplifier (often referred to as an op-amp) is a DC-coupled high-gain electronic voltage amplifier with a differential input and, usually, a single-ended output. In this configuration, an op-amp produces an output potential (relative to circuit ground) that is typically hundreds of thousands of times larger than the potential difference between input terminals of the op-amp. By applying negative feedback on an op-amp, the operational characteristics of the op-amp circuit, including the op-amp's gain, input and output impedance, bandwidth are determined by external components and have little dependence on temperature coefficients or manufacturing variations in the op-amp itself. Op-amps are among the most widely used electronic devices, and op-amps are employed in an array of consumer, industrial, and scientific devices. Op-amps can be packaged as components. Alternatively, op-amps can be employed as elements of more complex integrated circuits.

Op-amps are often trimmed during or after manufacture to improve the precision and accuracy of the devices. Some of the main objectives for trimming techniques include the correction of parameters of the op-amp, such as offset, gain, temperature drift and the like. To perform trimming, test circuitry is often used to measure the device parameters to make a determination as to how many and which of the specific memory cells in an op-amp should be programmed.

SUMMARY

An operational amplifier (op-amp) integrated circuit (IC) chip is disclosed. More particularly, the op-amp IC chip includes a trimming module for trimming the op-amp.

One example relates to an integrated circuit (IC) chip that can include an operational amplifier with adjustable operational parameters. The IC chip can also include a trimming module configured to measure an output voltage of the operational amplifier in response to at least one of detecting that the operational amplifier has a positive supply voltage set to a level greater than a predetermined level and detecting a given common mode voltage at inverting and non-inverting inputs of the operational amplifier. The trimming module can also be configured to adjust the operational parameters of the operational amplifier based on the output voltage to trim the operational amplifier.

Another example relates to a system that can include an operational amplifier IC chip. The IC chip can include an operational amplifier having an inverting input and a non-inverting input. The IC chip can also include a trimming module that trims the operational amplifier in response to detecting a command for the operational amplifier IC chip to operate in a trim mode. The IC chip can further include a trim mode supply voltage that provides a predetermined supply voltage to a positive supply voltage of the operational amplifier to trigger operation of the IC chip in the trim mode and the trim mode supply voltage providing a common mode voltage to the inverting input and the non-inverting input of the operational amplifier.

Yet another example relates to a method that can include triggering, at a trimming module of an IC chip that includes an operational amplifier, the IC chip to operate in a trim mode based on at least one of a predetermined positive supply voltage of the operational amplifier and a predetermined common mode voltage applied at an inverting input and a non-inverting input of the operational amplifier. The method can also include adjusting, at the trimming module, a trim control signal that changes an operational parameter of the amplifier to trim the operational amplifier in response to the triggering. The method can further include measuring, at the trimming module, an output voltage of the operational amplifier based on the adjusting in response to the triggering. The method can yet further include determining, at the trimming module, whether the trim control signal is acceptable based on the measured output voltage and writing a value to a one-time programmable, non-volatile memory, wherein the value corresponds to the trim control signal that is acceptable.

DETAILED DESCRIPTION

An operational amplifier (op-amp) integrated circuit (IC) chip is disclosed. The op-amp IC chip can employ an integrated op-amp to measure an offset during trimming procedure after fabrication of the op-amp IC chip. The op-amp IC chip can include a trimming module that can detect a Trim-On Reset (TOR) command.

During a trimming procedure (process), both inputs (an inverting and a non-inverting) of the op-amp are connected to a common voltage source at a predetermined voltage level where an offset is expected. To signal that the trimming procedure has commenced (e.g., the TOR command), a supply voltage of the op-amp can be increased above a predetermined nominal voltage. For example, if the nominal voltage is about 5 volts (V), the supply voltage can be increased to a range of about 6.5 V to about 7.5 V. This increase does not typically damage the op-amp, and facilitates writing of one-time programmable (OTP), non-volatile memory, as described herein. Additionally or alternatively, in some examples, a given common mode voltage at the inverting and non-inverting inputs of the op-amp can be set to a given level to signal that the trimming mode has commenced (e.g., the TOR command).

Upon detecting that the trimming procedure has commenced, an oscillator can generate a clock signal. The oscillator can provide the clock signal to Successive Approximation (SAR) logic driven by an output of the op-amp output. During the trimming procedure, the op-amp operates as a comparator of its own offset voltage. Moreover, based on the op-amp output, the SAR logic can write one or more values to memory that control an offset voltage of the op-amp. In particular, the one or more values are employed to control switches that adjust internal operational parameters of the op-amp (e.g., internal current and/or internal resistance) during normal operation of the op-amp.

Figure 1:
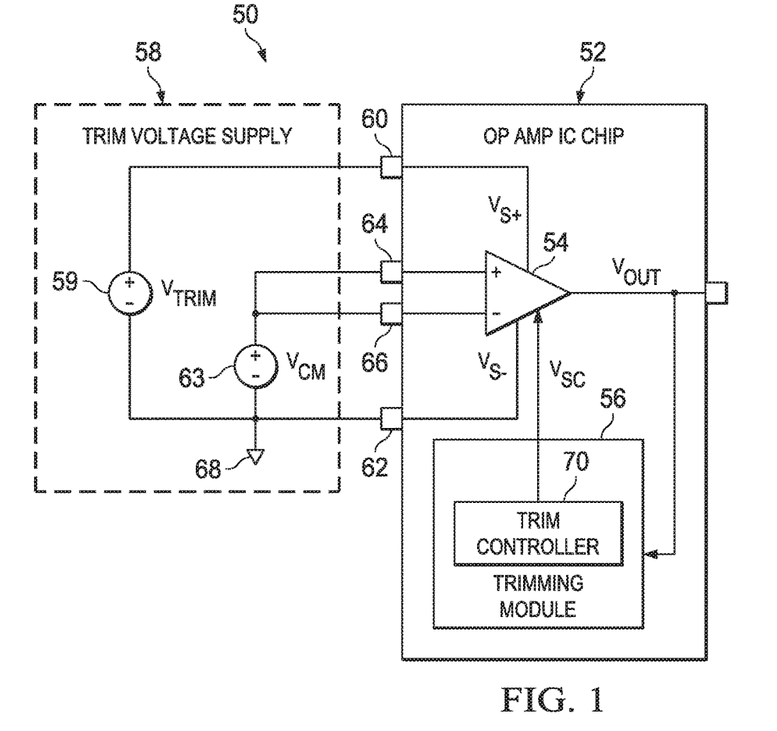
FIG. 1 illustrates a diagram of a system for trimming an operational amplifier (op-amp) integrated circuit (IC) chip.

FIG. 1 illustrates a block diagram of a system 50 for trimming an integrated circuit (IC) chip 52 that includes an operational amplifier (op-amp) 54, such that the IC chip 52 can be referred to as an op-amp IC chip 52. Fabrication tolerances of the op-amp IC chip 52 allow for situations where the internal components (e.g., transistors and resistors) cause operational parameters of the op-amp 54 to operate at levels outside acceptable limits. Accordingly, the op-amp IC chip 52 can include an internal trimming module 56 that can measure an output voltage, $V_{OUT}$, and generate a control voltage, $V_{SC}$, for the op-am 54 that causes the op-amp 54 to compensate for an undesired offset voltage, $V_{OS}$.

For purposes of simplification of explanation, the trimming module 56 is illustrated and described as being external to the op-amp 54. However, in some examples, the trimming module 56 can be representative of a module internal to the op-amp 54.

Upon fabrication of the op-amp IC chip 52, the op-amp IC chip 52 can be electrically coupled to a trim voltage supply 58. The trim voltage supply 58 can be, for example, test circuitry (e.g., automatic test equipment (ATE)) configured to actuate a trimming procedure at the trimming module 56 of the op-amp IC chip 52. The trim voltage supply 58 can include a trimming voltage source 59 that applies a trimming voltage, $V_{TRIM}$, that is coupled to a positive power supply, $V_{S+}$, via a lead (pin) 60 and a negative power supply, $V_{S-}$, of the op-amp via a lead 62. Additionally, an inverting input lead 65 and a non-inverting input lead 66 can be shorted together in the trim voltage supply 58. Moreover, a common mode supply 63 can apply a common mode voltage, $V_{CM}$, to both an inverting input lead 64 and a non-inverting input lead 66 of the op-amp 54.

The op-amp 54 can be configured to operate a nominal voltage, $V_{NOM}$. The nominal voltage, $V_{NOM}$, is a voltage at which the op-amp 54 is configured/designed to operate at or near a 100% duty cycle. In some examples, the nominal voltage, $V_{NOM}$ can be a voltage of about 5 V. The trimming voltage, $V_{TRIM}$ is greater than the nominal voltage, $V_{NOM}$. Equation 1 defines an example relationship between the trimming voltage, $V_{TRIM}$ and the nominal voltage, $V_{NOM}$. As demonstrated in Equation 1, in examples where $V_{NOM}$ is about 5 V, the trimming voltage, $V_{TRIM}$ can be about 6.5 V to about 7 V.

$$V_{TRIM} \approx (1.35 \pm 0.05) V_{NOM} \quad \text{Equation 1}$$

Initially, the common mode supply 63 can set the common mode voltage $V_{CM}$ to a voltage level with a predetermined/known voltage offset, which voltage level can be referred to as the offset voltage level, $V_{OS}$. For example, the op-amp 54 may be rated to have voltage offset voltage in situations where the common mode voltage, $V_{CM}$ is about 1 V over $V_{S-}$, at about one-half of the nominal voltage, $V_{NOM}$ (e.g., about 2.5 V) and/or in situations where the common mode voltage $V_{CM}$ is about 0.5 V less than the positive supply voltage, $V_{S+}$ (e.g., about 6.5 V). In such a situation, the common mode supply 63 can set the common mode voltage, $V_{CM}$, to the voltage level with the known voltage offset. Moreover, the trimming voltage source 59 can apply the trimming voltage, $V_{TRIM}$ (e.g., about 6.5 V to about 7 V), to the positive supply voltage $V_{S+}$ (e.g., a TOR command) and the negative supply voltage $V_{S-}$ can be coupled to an electrically neutral node 68 (e.g., ground) to trigger operating the op-amp IC chip 52 in a trim mode.

Additionally or alternatively, a given common mode voltage, $V_{CM}$ (e.g., a voltage at about 0.5 V less than the nominal voltage, $V_{NOM}$), can be set at the inverting and the non-inverting inputs of the op-amp 54 to actuate the trimming procedure (e.g., the TOR command). In such a situation, the trimming module 56 can detect the given common mode voltage, $V_{CM}$, applied at both the inverting and non-inverting inputs of the op-amp 54 and initiate the trimming procedure in response the detection. In some examples, multiple trimming procedures can be executed. For instance, in some such examples, the positive supply voltage $V_{S+}$ can be set for a given trimming procedure, and the common mode voltage, $V_{CM}$, can be set for another trimming procedure.

Upon application of the trim voltage, $V_{TRIM}$ by the trimming voltage source 59, the trimming module 56 can trigger a trimming procedure. In some examples, the trimming module 56 can measure the positive supply voltage, $V_{S+}$, of the op-amp 54. Accordingly, upon detecting the positive supply voltage, $V_{S+}$, being set to voltage at or near the trim voltage, $V_{TRIM}$, the trimming module can actuate the trimming procedure (e.g., a TOR command). In other examples, a code sequence can be applied to an input of the op-amp IC chip 52 to indicate that the trimming procedure has commenced.

In the trimming procedure, the trimming module 56 can cause a trim controller 70 to provide a trim signal, $V_{SC}$ (e.g., a controlled voltage and/or current signal), of the trimming module 56 that adjusts (e.g., trims) operational parameters of the op-amp 54 which in turn adjusts the output voltage, $V_{OUT}$, of the op-amp 54. The trim controller 70 may be, for example, a digital-to-analog converter (DAC) that provides the trim signal, $V_{SC}$, that adjusts a current provided by internal transistors of the op-amp 54, such that the trim controller 70 can be referred to as a current DAC. In additional examples, the trim controller 70 may be a DAC that provides the trim signal, $V_{SC}$ to adjust a resistance of internal resistors of the op-amp 54, such that the trim controller 70 may be referred to as a resistor DAC. In further examples, the trim controller 70 may be configured to provide the trim signal, $V_{SC}$ to adjust a size of a bank of internal transistor devices of the op-amp 54, such that the trim controller 70 may be referred to as a transistor adjustor. That is, multiple transistor devices can be coupled in parallel in a bank of internal transistor devices, and the trim signal, $V_{SC}$ can be employed to control the number of transistor devices that are activated in the bank of internal transistor devices. Moreover, in some examples, the trim controller 70 can be configured as a combination of a current DAC, a resistor DAC and/or a transistor adjustor. In such a situation, multiple instances of the trimming module 56 and/or the trim controller 70 may be fabricated on the op-amp IC chip 52 to adjust different operational parameters of the op-amp 54.

The trimming module 56 can measure the output voltage, $V_{OUT}$, of the op-amp 54 to determine the trim signal, $V_{SC}$, that results in an output voltage, $V_{OUT}$, at or near 0 V (e.g., electrically neutral). The trimming module 56 can record data characterizing the trim control signal, $V_{SC}$, with the output voltage at or near 0 V in a non-volatile memory. Moreover, the trimming module 56 can also disable further trimming procedures, such that the trimming procedure is executed once for the op-amp IC chip 52.

The op-amp IC chip 52 can be configured such that upon completion of the trimming procedure, the op-amp IC chip 52 can be decoupled (e.g., removed) from the trim voltage supply 58 and subsequently employed in another circuit. In such a situation, the trim controller 70 can provide the trim signal, $V_{SC}$, that achieved an output voltage, $V_{OUT}$, of about 0 V with a common mode voltage signal, $V_{CM}$, at the offset voltage level, $V_{OS}$. In this manner, the op-amp 54 is considered to be "trimmed" and can operate as a precision op-amp.

By employment of the op-amp IC chip 52, no external measurements of operational parameters, such as input and/or output currents and/or voltages of the op-amp 54 are needed to trim the op-amp 54. Thus, the time and expense of measuring such operational parameters with external circuitry can be avoided. Furthermore, as explained herein, the components of the trimming module 56 are relatively small. Thus, the inclusion of the trimming module 56 does not significantly increase a die size (or cost) of the op-amp IC chip 52. The trim voltage supply 58 sets the trim voltage at the trimming voltage source 59, $V_{TRIM}$, and the common mode voltage, $V_{CM}$, at the common mode supply 63 and waits a time sufficient (e.g., 5-20 milliseconds) to determine the trim control signal, $V_{SC}$. Thus, the trim voltage supply 58 can be implemented with relatively simple hardware and/or software.

Figure 2:
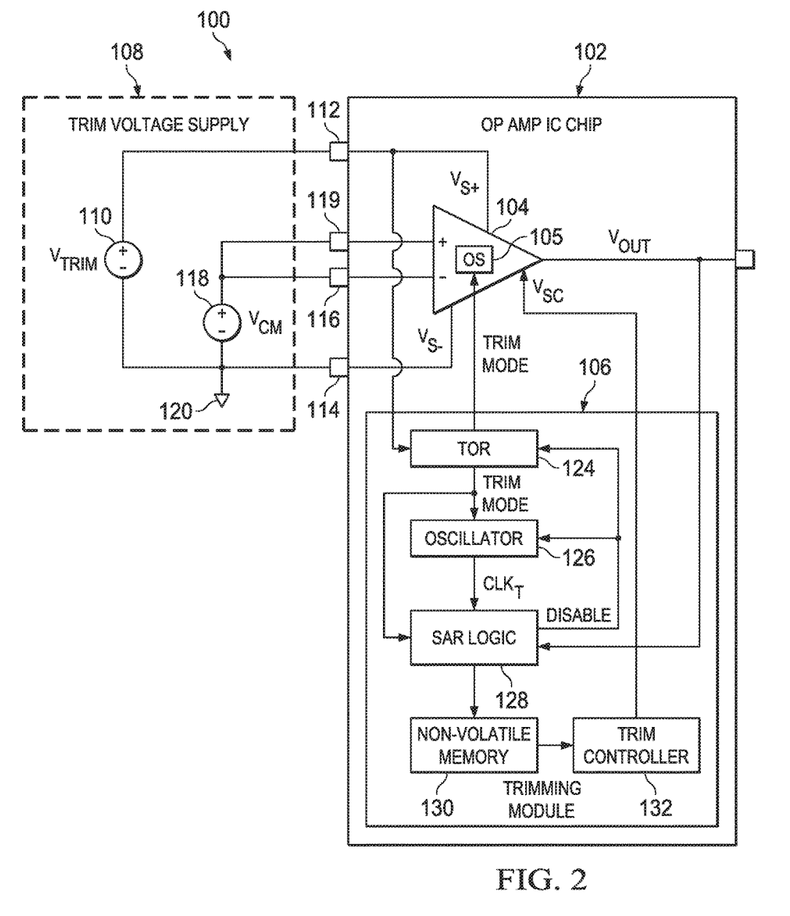
FIG. 2 illustrates a diagram of another example of a system for trimming an op-amp IC chip.

FIG. 2 illustrates another block diagram of a system 100 for trimming an op-amp IC chip 102. Fabrication tolerances of the op-amp IC chip 102, allow for situations where the internal components (e.g., transistors and resistors) cause operational parameters of an op-amp 104 in the op-amp IC chip 102 to operate with an offset voltage, $V_{OS}$, outside acceptable limits. Accordingly, the op-amp IC chip 102 can include an internal trimming module 106 that can measure an output voltage, $V_{OUT}$, and generate a control voltage, $V_{SC}$, for the op-amp 104 that causes the op-amp 104 to compensate for an offset voltage, $V_{OS}$.

It is noted that in the examples illustrated and described herein, the op-amp IC chip 102 (and the op-amp IC chip 52 of FIG. 1) is shown as having a single op-amp. In other examples, multiple op-amps and/or other circuit components can be embedded on the op-amp IC chip 102.

The op-amp 104 can include an output stage 105. The output stage 105 of the op-amp 104 can include compensation capacitors and/or transistors for signal conditioning and/or to lower an output impedance of the op-amp 104.

More particularly, upon fabrication of the op-amp IC chip 102, the op-amp IC chip 102 can be electrically coupled to a trim voltage supply 108. The trim voltage supply 108 can be, for example, test circuitry (e.g., a component of a test system) configured to actuate a trimming procedure at the trimming module 106 of the op-amp IC chip 102. The trim voltage supply 108 can include a trimming voltage source 110, $V_{TRIM}$, that is coupled to a positive supply voltage, $V_{S+}$, via a lead (pin) 112 and a negative supply voltage, $V_{S-}$, of the op-amp via a lead 114. Additionally, an inverting input lead 116 and a non-inverting input lead 117 can be shorted together in the trim voltage supply 108. Moreover, a common mode supply 118 can apply common mode voltage, $V_{CM}$, to both the inverting input lead 116 and the non-inverting input lead 117 of the op-amp 104.

The op-amp 104 can be configured to operate at a nominal voltage, $V_{NOM}$, for a duty cycle of about 100%. In some examples, the nominal voltage, $V_{NOM}$, can be a voltage of about 5 V. The trimming voltage, $V_{TRIM}$, is greater than the nominal voltage, $V_{NOM}$. Equation 1 defines an example relationship between the trimming voltage, $V_{TRIM}$, and the nominal voltage, $V_{NOM}$. In examples where $V_{NOM}$ is about 5 V, the trimming voltage, $V_{TRIM}$, can be about 6.5 V to about 7 V.

Initially, the common mode supply 118 can set the common mode voltage $V_{CM}$ to a voltage level with a predetermined/known voltage offset, which voltage level can be referred to as the offset voltage level, $V_{OS}$. For example, the op-amp 54 may be rated to have voltage offset voltage in situations where the common mode voltage, $V_{CM}$, is about 1 V over $V_{S-}$, at about one-half of the nominal voltage, $V_{NOM}$ (e.g., about 2.5 V). Additionally or alternatively, the op-amp 54 may be rated to have voltage offset voltage for a common mode voltage (or a range of common mode voltages). For example, the op-amp 54 may be rated to have a voltage offset in situations where the common mode voltage $V_{CM}$ is about 0.5 V less than the positive supply voltage, $V_{S+}$ (e.g., about 6.5 V). In such a situation, the common mode supply 118 can set the common mode voltage, $V_{CM}$, to the level with the known voltage offset. Moreover, the trim voltage supply 110 can apply the trimming voltage, $V_{TRIM}$ (e.g., about 6.5 V to about 7 V), to the positive supply voltage $V_{S+}$ and the negative supply voltage $V_{S-}$ can be coupled to an electrically neutral node 120 (e.g., ground).

The trimming module 106 can include a trim-on reset (TOR) module 124 that can be coupled to the positive voltage supply, $V_{S+}$, of the op-amp 104 to trigger a trimming procedure for the op-amp 104 has commenced. Additionally or alternatively, the trimming module 106 can detect that a given common mode voltage (e.g., $V_{CM}$ is set to about 1 V over $V_S$ and/or $V_{CM}$ is set to about 0.5 V less than $V_{NOM}$) is applied at both the inverting and non-inverting inputs of the op-amp 104 to detect that the trimming procedure has commenced. In some examples, multiple trimming procedures can be executed. For instance, in some such examples, the positive supply voltage $V_{S+}$, can be set to $V_{TRIM}$ for a given trimming procedure, and the common mode voltage $V_{CM}$, can be set to the given mode voltage for another trimming procedure. A trim mode signal, TRIM MODE can be output by the TOR module 124, which can indicate a status of the trimming procedure.

Figure 3:
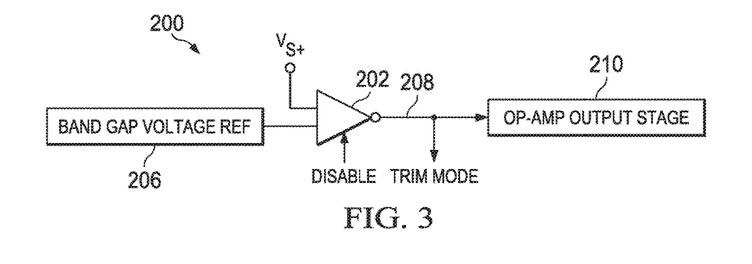
FIG. 3 illustrates a diagram of an example trim-on reset module for a trimming module.

FIG. 3 illustrates an example of a diagram of a TOR module 200 that may be employed, for example, to implement the TOR module 124 of FIG. 2. The TOR module 200 can include a comparator 202. The comparator 202 can compare a voltage level of a positive supply voltage, $V_{S+}$ (e.g., $V_{S+}$ of FIG. 2) with an output voltage of a bandgap voltage reference 206. The bandgap voltage reference 206 can be implemented as a voltage reference circuit that can produce a substantially fixed (constant) voltage that is substantially independent of power supply variations, temperature changes and circuit loading from a device. The bandgap voltage reference 206 can be set to output a voltage equal to (or nearly equal to) a trimming voltage $V_{TRIM}$, (e.g., the trimming voltage $V_{TRIM}$, illustrated in FIG. 2).

The comparator 202 can receive a disable signal (labeled in FIG. 3 as "DISABLE") that (if asserted) disables an output of the comparator 202. An inverted output of the comparator 202 can be a trim mode signal (labeled in FIG. 3 as "TRIM MODE") that indicates whether a trimming procedure is detected. For instance, in situations where the disable signal, is not asserted (logical '0'/'off'), the inverted output 208 of the comparator 202 (the trim mode signal) can output a logical '1' (e.g., 'on') if the positive supply voltage, $V_{S+}$, is greater than the output of the bandgap voltage reference 206, which can indicate that the trimming procedure has commenced. Conversely, if the disable signal is not asserted, the inverted output 208 can output a logical '0' (e.g., 'off') as the trim mode signal if the positive supply voltage $V_{S+}$, is less than the output of the bandgap voltage reference 206, which can indicate that the trimming procedure has not commenced. Furthermore, if the disable signal is asserted (logical '1'/'on'), the comparator 202 can be permanently disabled, thereby permanently forcing the trim mode signal to a logical '0' ('off') state.

The trim mode signal can be output by the TOR module 200. Additionally, the trim mode signal can be provided to an output stage 210 of an op-amp (e.g., the output stage 105 in FIG. 1). The output stage 210 can include circuitry (e.g., transitory switches) that disconnects/bypasses compensation capacitors of the op-amp (e.g., the op-amp 104 of FIG. 1). Upon disconnecting the compensation capacitors of the op-amp 104, a slew rate of the op-amp is increased, thereby increasing a rate of comparison of input voltages at the op-amp.

Referring back to FIG. 2, the TOR module 124 can provide the trim mode signal to an oscillator 126. If the trim mode signal indicates that the trimming procedure is in process (e.g., with a logical '1'), the oscillator 126 can generate a trim clock signal, $CLK_T$, with a predetermined frequency. The predetermined frequency can be selected, for example, based on a comparator propagation delay of the op-amp 104. The predetermined frequency can be about 1 kilohertz or less. The trim clock signal, $CLK_T$, can be provided to a successive approximation (SAR) logic module 128.

Figure 4:
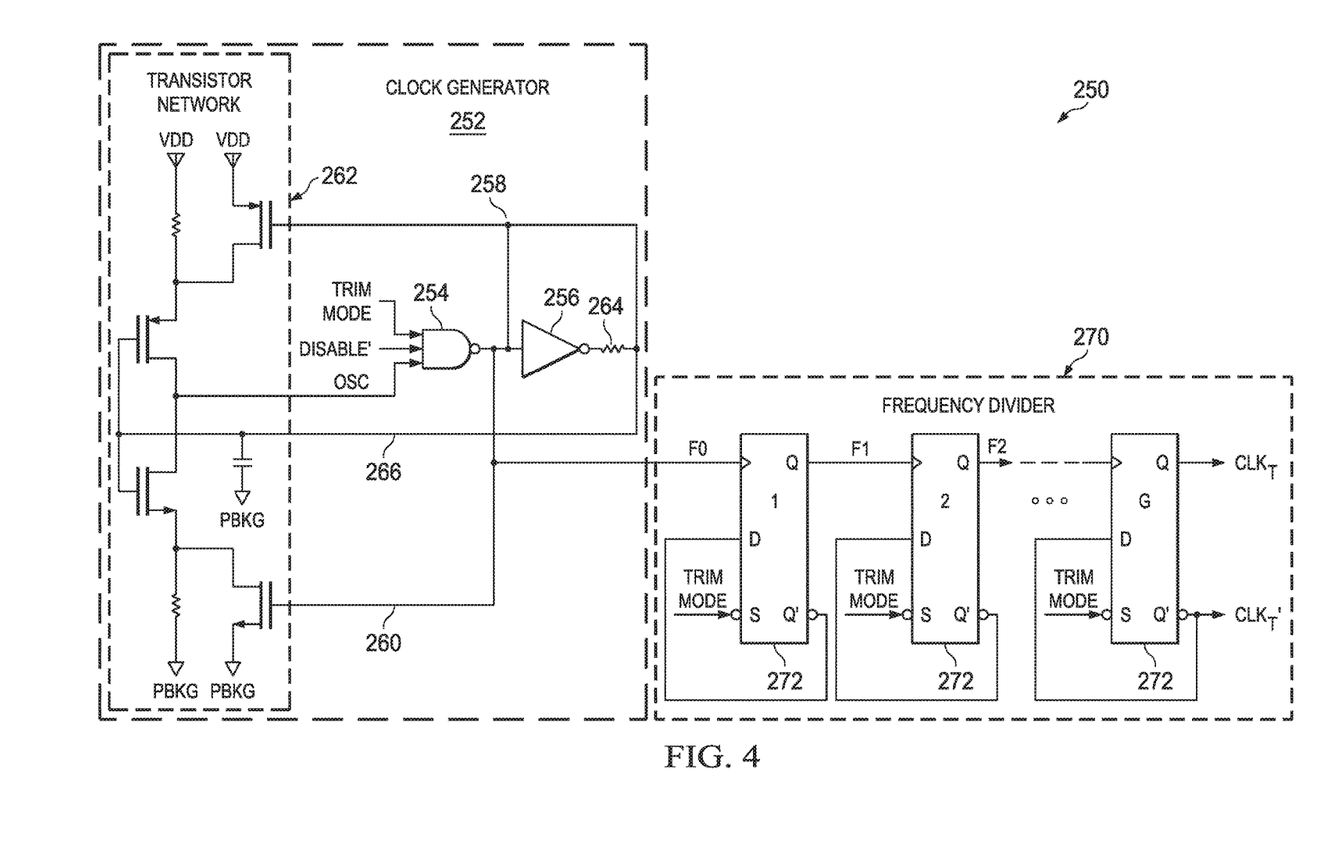
FIG. 4 illustrates a diagram of an example of an oscillator.

FIG. 4 illustrates a diagram of an oscillator 250 that can be employed to implement the oscillator 126 of FIG. 2. The oscillator 250 can include a clock generator 252 that can receive the trim mode signal at an input of a NAND gate 254. A complement of a disable signal, DISABLE', which can indicate that whether (or not) the trim mode has been disabled can also be provided to the input of the NAND gate 254. The output of the NAND gate 254 can be provided to an inverter 256 and first input node 258 and a second input node 260 of a transistor network 262.

The output of the inverter 256 can be coupled to a resistor 264. The resistor 264 can also be coupled to the first input node 258 and a third input node 266 of the transistor network 262. The transistor network 262 is arranged, as illustrated in FIG. 4 to control a network of metal oxide semiconductor field effect transistors (MOSFETs), to generate an oscillating signal, OSC, that is provided to an input of the NAND gate 254 that swings between a high voltage (e.g., 5 V) signal, VDD, and a low voltage (e.g., about 0 V) signal, PBKG. The transistor network 262 can include p-channel MOSFETs (PMOSs) and n-channel MOSFETs (NMOSs).

The output of the NAND gate 254 can also provide a clock signal, F0, with an initial clock frequency, to a frequency divider 270 of the oscillator 250. In one example, the initial frequency of the clock signal, F0, can be about 32 kilohertz (kHz), but in other examples, the initial frequency of the clock signal, F0, can be greater or less than 32 kHz. The oscillator 250 can include a frequency divider 270 formed of G number of cascaded D flip-flops 272, where G is an integer greater than or equal to two. Each D flip-flop 272 can reduce a frequency of an incoming clock signal by about one-half.

In particular, a first D flip-flop 272 (D flip-flop 1 in FIG. 4) can receive the clock signal, F0, at the initial frequency at a clock input. An inverted S input of the first D flip-flop 272 can receive the trim mode signal. Moreover, an inverted output, Q' of the first D flip-flop 272 can be fed back into a D input of the first D flip-flop 272. Additionally, the (non-inverted) output, Q of the first D flip-flop 272 can be coupled to a clock input of the second D flip-flop 272 (D flip-flop 2 in FIG. 4). Moreover, the remaining inputs and outputs can be coupled in the same manner as the first D flip-flop 272.

Similarly, each of the third through Gth D flip-flop 272 (D flip-flop G) can also be configured in the same way, except that the (non-inverted) output, Q of the Gth D flip-flop 272 provides the trim clock signal, $CLK_T$. Thus, in examples where the clock signal, F0, has an initial frequency of about 32 kHz, the trim clock signal, $CLK_T$, has a frequency of about 1 kHz if G is equal to six (6).

As illustrated in FIG. 4, the clock generator 252 of the oscillator 250 can be implemented with IC chip compatible components (e.g., gates, transistors, resistors and capacitors). Moreover, by implementing the frequency divider 270, the use of a relatively (physically) large resistor and/or capacitor (to generate a large RC constant) to implement the relatively slow trim clock signal, $CLK_T$ (with a frequency of 1 kHz) can be avoided.

Referring back to FIG. 2, the trim clock signal, $CLK_T$, and the trim mode signal can be provided to the SAR logic 128. The SAR logic 128 can also receive an output signal, $V_{OUT}$, from the op-amp 104. The SAR logic 128 can write values into a non-volatile (and possibly, one-time programmable) memory 130 that cause a trim controller 132 to provide a trim control signal, $V_{SC}$, that adjusts the offset voltage of the op-amp 104. In particular, the trim control signal, $V_{SC}$, can control switches of the op-amp 104 that adjusts the output voltage, $V_{OUT}$.

Figure 5:
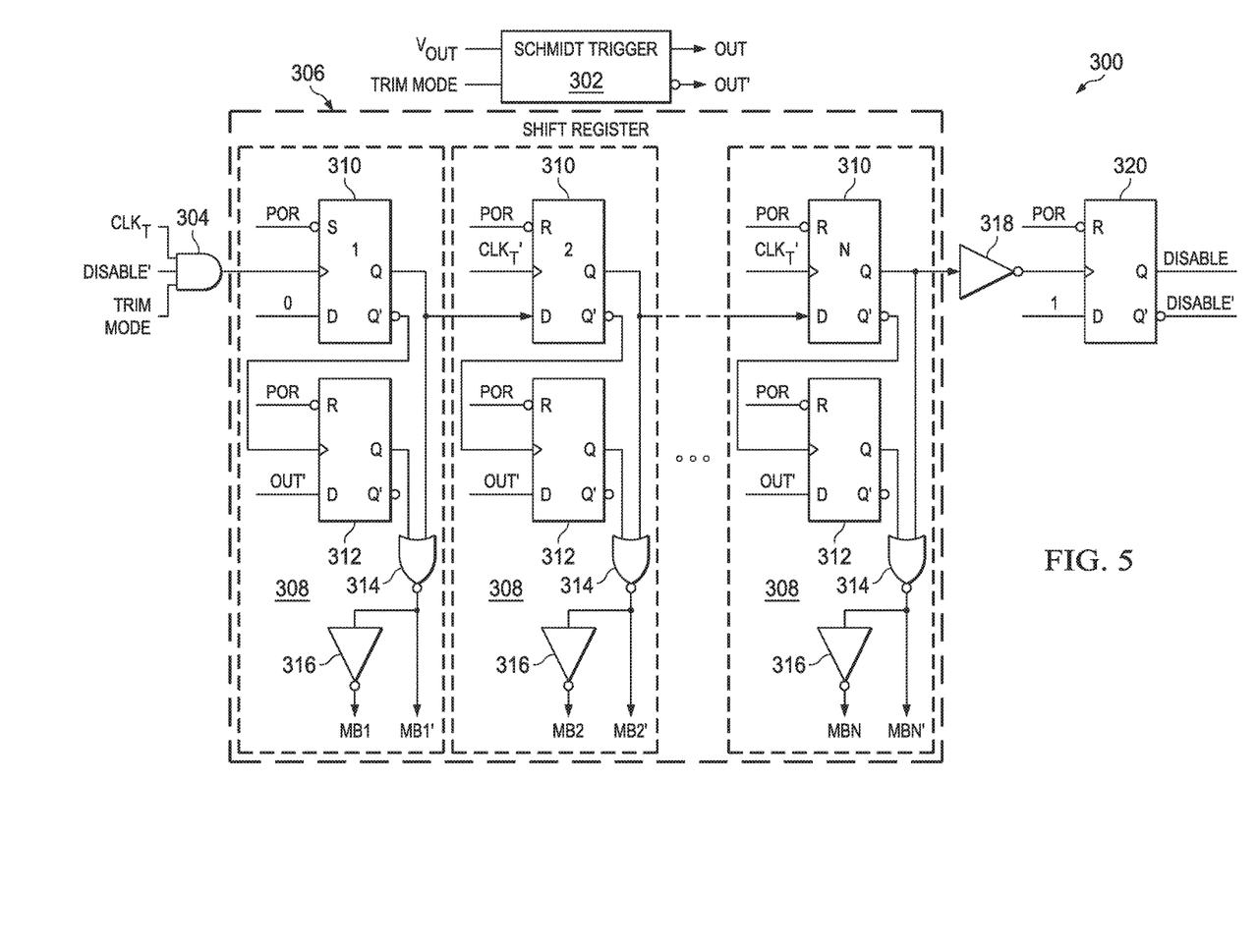
FIG. 5 illustrates a diagram of an example of successive approximation (SAR) logic.

FIG. 5 illustrates a diagram of an example of SAR logic 300 that may be employed, for example, to implement the SAR logic 128 of FIG. 2. The SAR logic 300 can include a Schmidt trigger 302 that can receive the output signal of the op-amp, $V_{OUT}$ (the op-amp 104 of FIG. 2), and the trim mode signal. The Schmidt trigger 302 can apply signal conditioning on the output signal of the op-amp, $V_{OUT}$ to "sharpen" rising and falling edges of the output signal, $V_{OUT}$. Accordingly, as long as the trim mode signal is asserted (e.g., a logical '1'/'on'), the Schmidt trigger 302 can generate an output signal, OUT (and the complement, OUT'), of the Schmidt trigger 302 that is nearly a square wave with rising and falling edges corresponding to rising and falling edges of the output signal, $V_{OUT}$.

The SAR logic 300 can also include an AND gate 304 that can receive the trim clock signal, $CLK_T$, the trim mode signal and a complement of a trim disable signal, DISABLE' at inputs. The output of the AND gate 304 can be provided to a shift register 306.

The shift register 306 can be formed of N number of bit controllers 308, where N is an integer greater than or equal to two. The number N of bit controllers 308 can correspond to a number of bits in memory (e.g., the non-volatile memory 130 of FIG. 2) that are employed to control a trim controller (e.g., the trim controller 132 of FIG. 2). With a greater number of bits employed to store a trim code in the memory, the resolution/precision of the output of the trim controller is increased. In some examples, N can be 6-10. Each bit controller 308 can be formed with a first D flip-flop 310 and a second D flip-flop 312. An inverted output, Q' of the first D flip-flop 310 can be coupled to a clock input of the second D flip-flop 312 in each bit controller 308. Additionally, in the first bit controller 308, an inverted S input of the first D flip-flop 310 can be coupled to a power-on reset signal, POR, and in the second through Nth bit controllers 308, an inverted R input of the first D flip-flop 310 can be coupled to the power-on reset signal, POR. At each of the first through Nth bit controllers 308, the R input of the second D flip-flop 312 can be inverted and coupled to the power-on reset signal, POR. The power-on reset signal, POR, is asserted (e.g., logical '1') as long as power is provided to the op-amp IC chip (the op-amp IC chip 102 of FIG. 2).

During operation, supply voltage is initially low, and the power-on reset signal POR is low (e.g., logical '0'), such that the power-on reset signal, POR, sets the first D flip-flop 310 of the first bit controller 308. Additionally, the power-on reset signal, POR, resets the first D flip-flop 310 of each of the second through Nth bit controllers 308 as well as the second flip-flop 312 of each of the N number of bit controllers 308. Upon the supply voltage reaching a level sufficient for operation of the op-amp, the power-on reset signal, POR, is high (e.g., logical '1'), such that the power-on reset signal, POR, ceases affecting further operation of the first or second D flip-flops 310 and 312 in each of the N bit controllers 308.

The non-inverted output, Q of the first D flip-flop 310 and the second D flip-flop 312 can be provided to an input of a NOR gate 314. Furthermore, a D input of the second D flip-flop 312 receives the complement of the output signal, OUT' of the Schmidt trigger 302. In each bit controller 308, an output of the NOR gate can be provided to an input of a NOT gate 316. Additionally, the output of the NOT gate 316 and the output of the NOR gate 314 can each be coupled to a memory bit, as denoted by the symbols MB1 . . . MBN and MB' . . . MBN'.

The N number of bit controllers 308 can be arranged such that the first bit controller 308 (bit controller 1) receives the output of the AND gate 304 at a clock input, and a D input of the first D flip-flop 310 is coupled to a logical '0' (e.g., "OFF"). Furthermore, the second through Nth bit controllers 308 (bit controllers 2-N) can each receive the non-inverted output, Q of the previous first D flip-flop 310 and the trimming clock signal, $CLK_T$ at the clock of the first D flip-flop 310.

Furthermore, a non-inverted output, Q of the first D flip-flop 310 of the Nth bit controller 308 (bit controller N) can be provided to a NOT gate 318. An output of the NOT gate 318 can be coupled to a clock input of an output D flip-flop 320. An inverted R input of the output D flip-flop 320 can be coupled to the power-on reset, POR, signal and a D input of the output D flip-flop 320 can be coupled to a logical '1' (e.g., 'on').

The shift register 306 is arranged such that as the trim clock, $CLK_T$, pulses, a logical '1' is shifted at the output of MB1 toward MBN. As the logical '1' shifts in the shift register 306 towards MBN, the value represented by MB1 . . . MBN changes (increases), and the trim controller (the trim controller 70 of FIG. 2) changes the control signal, $V_{SC}$. Moreover, upon the output of the Nth first D flip-flop 310 providing an output of a logical '0' to the NOT gate 318, the output D flip-flop 320 asserts (switches to logical '1') the disable signal, DISABLE at the non-inverted output and the complement of the disable signal, DISABLE', is de-asserted (switched to logical '0') at the inverted output. Upon de-assertion of the DISABLE' signal, the shift register 306 stops (since the output of the AND gate 304 is de-asserted (turned to a logical 0)). As illustrated in FIGS. 2-4, the disable signal, DISABLE, and the complement of the disable signal, DISABLE', can be provided to the TOR module 124 and the oscillator 126.

By changing the values of MB1 . . . MBN (a shift register) in this manner, the trim controller is indirectly controlled by the SAR logic 300. More particularly, the trim controller changes the trim control signal, $V_{SC}$, as the value of the memory (controlled by the shift register 306) changes at a resolution dictated by the number N. In some examples, the trim control signal, $V_{SC}$, can have a voltage that is controlled at a resolution of about 1 microvolt (µV).

Upon the trim control signal, $V_{SC}$, being set to a level that causes the output voltage, $V_{OUT}$, to drop to about 0 V, the complement of the Schmidt trigger 302 output, OUT', is asserted (e.g., a logical '1' or high state). In this situation, the current value output at MB1 . . . MBN can be written into non-volatile memory (which can be one time programmable memory). In this manner, the memory bits (e.g., a memory bank) at the non-volatile memory can be written to (nearly) concurrently. Memory writing can be executed on each trimming action but memory writing is often executed for the whole memory bank after the trimming procedure ends. Data (information) that is to be written into memory bits is contained in the D flip-flops of shift register 306 as long as a supply voltage is on. Writing the bits in the memory bank together also allows an additional error-correction bits to be added to improve reliability of the op-amp, which can reduce the chances that a trim code (the value in the stored in the memory bits) changes even in situations where some of the memory bits are lost (e.g., due to static discharge).

Referring back to FIG. 2, as illustrated in FIG. 3 upon assertion of the disable signal, DISABLE, the TOR module 124 disables the trim mode signal, which causes the output stage 105 of the op-amp 104 to re-activate (e.g., recouple) the compensation capacitors of the op-amp 104. Thus, the op-amp IC chip 102 can be removed/decoupled from the trim voltage supply 108. Moreover, since the value in the non-volatile (and possibly one-time programmable) memory 130 remains constant, upon subsequent powering of the op-amp IC chip 102, the control voltage signal $V_{SC}$ is provided to trim the op-amp 104.

The trim controller 132 can be, for example, a current DAC, a resistive DAC and/or a transistor adjustor that adjusts operational parameters of the op-amp 104, which operational parameters affect the offset voltage of the op-amp 104.

By employment of the op-amp IC chip 102, no external measurements of operational parameters, such as input and/or output currents and/or voltages of the op-amp 102 are needed to trim the op-amp 104. Thus, the time and expense of measuring such operational parameters at external circuitry can be avoided. Furthermore, as illustrated in FIGS. 2-5, the components of the trimming module 106 are relatively small (e.g., IC chip compatible components). Thus, the inclusion of trimming module 106 does not significantly increase a die size or cost of the op-amp IC chip 102.

Figure 6:
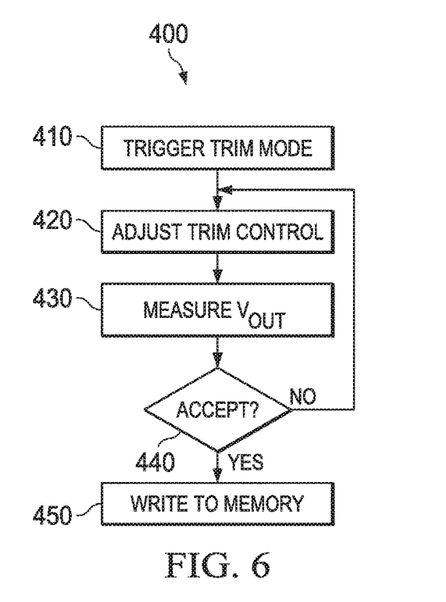
FIG. 6 illustrates a flowchart of an example method for trimming an op-amp IC chip.

In view of the foregoing structural and functional features described above, example methods will be better appreciated with reference to FIG. 6. While, for purposes of simplicity of explanation, the example method of FIG. 6 is shown and described as executing serially, it is to be understood and appreciated that the present examples are not limited by the illustrated order, as some actions can in other examples occur in different orders, multiple times and/or concurrently from that shown and described herein. Moreover, it is not necessary that all described actions be performed to implement a method.

FIG. 6 illustrates a flowchart of an example method 400 for trimming an op-amp IC chip. The method 400 may be implemented, by the op-amp IC chip being trimmed, such as the op-amp IC chip 52 of FIG. 1 and/or the op-amp IC chip 102 of FIG. 2. At 410, a trimming module (e.g., the trimming module 56 of FIG. 1) integrated or coupled with the op-amp IC chip can trigger operation of the op-amp IC chip in a trim mode. The triggering can be based, for example on detection of a high voltage (e.g., 7 V) signal at a supply voltage of an op-amp (e.g., the op-amp 54 of FIG. 1). Additionally or alternatively, the triggering can based on a detection of a predetermined common mode voltage being applied to an inverting input and a non-inverting input of the op-amp. In trim mode, an inverted and a non-inverting input of the op-amp can be coupled to a common mode voltage.

At 420, the trimming module can adjust a trim control signal, $V_{SC}$, that adjusts an output voltage, $V_{OUT}$, of the op-amp IC chip. At 430, the output voltage, $V_{OUT}$, can be measured by the trimming module. At 440, a determination can be made as to whether to accept the trim control signal, $V_{SC}$. The determination may be based, for example on the measured value of the output voltage, $V_{OUT}$, of the op-amp. For instance, if $V_{OUT}$ is about 0 V, the determination at 440 can be positive (e.g., YES) and the method 400 can proceed to 450. Conversely, if $V_{OUT}$ is not about 0 V (e.g., at a high voltage), the method 400 can return to 420.

In some examples, the SAR logic may cycle the memory and/or trim adjustment voltage through a series of value, levels or voltages until the offset voltage (detected at the output of the operational amplifier) falls below a threshold voltage (e.g., determined by a threshold voltage in the Schmidt trigger). When the offset value falls below the threshold voltage, the trim adjustment value, level, or voltage is stored in the memory of the op-amp IC for further use during normal operation (e.g., when not operating in trim mode) of the op-amp.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. An integrated circuit (IC) chip comprising:
   an operational amplifier with adjustable operational parameters; and
   a trimming module configured to:
      measure an output voltage of the operational amplifier in response to at least one of detecting that the operational amplifier has a positive supply voltage set to a level greater than a predetermined level and detecting a given common mode voltage at inverting and non-inverting inputs of the operational amplifier; and
      adjust the operational parameters of the operational amplifier based on the output voltage to trim the operational amplifier;
   wherein the trimming module comprises:
   successive approximation (SAR) logic that controls a memory value corresponding to a control signal to adjust the operational parameters of the operational amplifier;
   wherein the trimming module further comprises a trim controller that provides the control signal to the op-amp based on the memory value.

2. The IC chip of claim 1, wherein the trim controller comprises a current digital-to-analog converter (DAC) that adjusts an internal current of the operational amplifier to compensate for an offset voltage of the operational amplifier based on the memory value.

3. The IC chip of claim 1, wherein the trim controller comprises a resistive digital-to-analog converter (DAC) that adjusts an internal resistance of the operational amplifier based on the memory value to compensate for an offset voltage of the operational amplifier.

4. The IC chip of claim 1, wherein the trim controller adjusts a number of active internal transistor devices in a bank of internal transistor devices of the operational amplifier based on the memory value to compensate for an offset voltage of the operational amplifier.

5. An integrated circuit (IC) chip comprising:
   an operational amplifier with adjustable operational parameters; and
   a trimming module configured to:
      measure an output voltage of the operational amplifier in response to at least one of detecting that the operational amplifier has a positive supply voltage set to a level greater than a predetermined level and detecting a given common mode voltage at inverting and non-inverting inputs of the operational amplifier; and
      adjust the operational parameters of the operational amplifier based on the output voltage to trim the operational amplifier;
   wherein the trimming module comprises:
   successive approximation (SAR) logic that controls a memory value corresponding to a control signal to adjust the operational parameters of the operational amplifier;
   wherein the SAR logic is further configured to detect a given memory value corresponding to a given control signal that causes the output voltage to drop to about 0 V with the predetermined common mode voltage applied to the inverting and the non-inverting input of the operational amplifier.

6. The IC chip of claim 5, wherein, in response to detecting the given memory value, the SAR logic writes the given memory value into one-time programmable, non-volatile memory and disables further trimming of the operational amplifier.

7. An integrated circuit (IC) chip comprising:
   an operational amplifier with adjustable operational parameters; and
   a trimming module configured to:
      measure an output voltage of the operational amplifier in response to at least one of detecting that the operational amplifier has a positive supply voltage set to a level greater than a predetermined level and detecting a given common mode voltage at inverting and non-inverting inputs of the operational amplifier; and
      adjust the operational parameters of the operational amplifier based on the output voltage to trim the operational amplifier;
   wherein the trimming module comprises:
   successive approximation (SAR) logic that controls a memory value corresponding to a control signal to adjust the operational parameters of the operational amplifier;
   wherein the trimming module further comprises:
   an oscillator that provides a clock signal at a given frequency that controls a rate of a change of the memory value.

8. The IC chip of claim 7, wherein the given frequency is about 1 kilohertz or less.

9. An integrated circuit (IC) chip comprising:
an operational amplifier with adjustable operational parameters; and
a trimming module configured to:
measure an output voltage of the operational amplifier in response to at least one of detecting that the operational amplifier has a positive supply voltage set to a level greater than a predetermined level and detecting a given common mode voltage at inverting and non-inverting inputs of the operational amplifier; and
adjust the operational parameters of the operational amplifier based on the output voltage to trim the operational amplifier;
wherein the trimming module further comprises a trim-on reset (TOR) module comprising:
a bandgap reference voltage circuit that provides a reference voltage signal at the predetermined voltage level; and
a comparator that compares the voltage level of the positive supply voltage with the bandgap reference voltage to determine whether the IC chip is operating in the trim mode.

10. The IC chip of claim 9, wherein the comparator outputs a signal indicating that the IC chip is operating in a trim mode in response to detecting that the positive supply voltage exceeds the bandgap reference voltage.

11. The IC chip of claim 10, wherein the comparator disables a compensation capacitor of the operational amplifier in further response to detecting that the positive supply voltage exceeds the predetermined voltage level.

12. A method comprising:
triggering, at a trimming module of an integrated circuit (IC) chip comprising an operational amplifier, the IC chip to operate in a trim mode based on at least one of a predetermined positive supply voltage of the operational amplifier and a predetermined common mode voltage applied at an inverting input and a non-inverting input of the operational amplifier;
adjusting, at the trimming module, a trim control signal that changes an operational parameter of the amplifier to trim the operational amplifier in response to the triggering;
measuring, at the trimming module, an output voltage of the operational amplifier based on the adjusting in response to the triggering;
determining, at the trimming module, whether the trim control signal is acceptable based on the measured output voltage; and
writing a value to a one-time programmable, non-volatile memory, wherein the value corresponds to the trim control signal that is acceptable.

13. The method of claim 12, wherein the determining is based on detecting that the measured output voltage is about 0 V for the given common mode voltage applied to the inverting and non-inverting inputs of the operational amplifier.

* * * * *